(12) United States Patent
Blixt et al.

(10) Patent No.: US 8,402,302 B2
(45) Date of Patent: Mar. 19, 2013

(54) TIMER SYSTEM FOR MAINTAINING THE ACCURACY OF A REAL TIME CLOCK WHEN SYNCHRONIZATION SOURCE IS NOT AVAILABLE

(75) Inventors: Stefan Blixt, Bálsta (SE); Christian Blixt, Bálsta (SE)

(73) Assignees: IMSYS AB, Upplands Vasby (SE); Conemtech AB, Kista (SE)

( * ) Notice: Subject to any disclaimer, the term of this patent is extended or adjusted under 35 U.S.C. 154(b) by 255 days.

(21) Appl. No.: 13/001,916

(22) PCT Filed: Jun. 12, 2009

(86) PCT No.: PCT/SE2009/050729
§ 371 (c)(1),
(2), (4) Date: Mar. 15, 2011

(87) PCT Pub. No.: WO2010/002330
PCT Pub. Date: Jan. 7, 2010

(65) Prior Publication Data
US 2011/0161701 A1 Jun. 30, 2011

Related U.S. Application Data

(60) Provisional application No. 61/078,033, filed on Jul. 3, 2008.

(51) Int. Cl.
*G06F 1/00* (2006.01)
*G06F 1/14* (2006.01)
*G04C 13/00* (2006.01)

(52) U.S. Cl. .......... 713/500; 713/400; 713/502; 368/53; 368/56

(58) Field of Classification Search .................. 713/400, 713/500, 502; 368/53, 56
See application file for complete search history.

(56) References Cited

U.S. PATENT DOCUMENTS

| | | | | |
|---|---|---|---|---|
| 5,940,027 | A * | 8/1999 | Forseth et al. | 342/357.62 |
| 6,545,950 | B1 * | 4/2003 | Walukas et al. | 368/47 |
| 6,895,009 | B1 * | 5/2005 | Stallkamp | 370/394 |
| 2005/0079845 | A1 * | 4/2005 | Ansorge et al. | 455/255 |
| 2007/0291676 | A1 * | 12/2007 | Berggren | 370/328 |
| 2010/0100759 | A1 * | 4/2010 | Blixt et al. | 713/502 |

* cited by examiner

*Primary Examiner* — Vincent Tran
(74) *Attorney, Agent, or Firm* — Young & Thompson

(57) ABSTRACT

An electronic timer system includes a counter-based time generator for continuously generating raw base time, and a translator for translating between raw base time and local precise time. The counter-based time generator is driven by an oscillator. The timer system further includes a temperature sensor placed in the proximity of the oscillator or a crystal used by the oscillator, and a look-up control table holding temperature values associated with corresponding control values representative of the configurable parameter value A. The look-up control table is generated when the timer system is synchronized with a synchronization source so that the temperature and control values are characteristic of the operation of the timer system in synchronization. The timer system is also configured for reading, when no synchronization source is available, a temperature value from the temperature sensor, and for extracting, based on the temperature value, a control value from the look-up control table corresponding to a suitable (quantized) representation of the temperature value. The timer system is then able to configure the parameter variable A in accordance with the extracted control value.

11 Claims, 15 Drawing Sheets

Pulse output signal:
Pulse at time specified by application, at 0.1us resolution. Alternatively a higher frequency time signal

TIMER SYSTEM FOR MAINTAINING THE ACCURACY OF A REAL TIME CLOCK WHEN SYNCHRONIZATION SOURCE IS NOT AVAILABLE

TECHNICAL FIELD

The present invention generally relates to electronic timer systems and systems requiring precise time or frequency and in particular to synchronization over data communications and/or generation of precisely timed signals, and look-up table based synchronization.

BACKGROUND

In general, precise timing systems are used in a wide variety of technical applications, e.g. for the purpose of synchronizing movements of industrial machinery, controlling electric power generation and distribution, synchronizing data flows in telecommunication networks, and generating exact frequencies in radio base stations.

A telecom base station needs synchronization, in order to keep its radio frequencies, and in some cases its real-time clock time, within limits. Traditionally the very precise timing needed is extracted from the data stream received directly from the telecom service provider's communication lines (so-called E1/T1 lines, transferring 8000 frames of data per second with highly accurate frame rate). When the backhaul data traffic uses packet switching, however, this timing source no longer exists.

A GPS receiver can provide the needed synchronization, but only if it can have a sufficiently unobstructed view of the sky. Technologies like Synchronous Ethernet and IEEE 1588 are being considered for providing synchronization through the network, but they require infrastructure investments before they can become realistic and reliable solutions. A further complication is the fact that the telecom service providers need to use infrastructure owned by independent third parties in order to get the full cost advantage of packet-based communication.

It may be necessary to consider a synchronization source that has occasional interruptions; perhaps a combination of two or more such unreliable sources. However, interruptions of base station operation cannot be accepted. An oscillator in the unit is used to drive the local clock that is used as the source of precise frequencies and time, and this oscillator needs to be stable enough not to change frequency too much during synchronization outages. However, highly stable oscillators are expensive.

Atomic clocks are too expensive to be used in small base stations. Instead, the oscillator will use a quartz crystal. The resonant frequency of a quartz crystal changes slowly with age, has some dependence on circuit component values and on driving strength and thus of the supply voltage of the oscillator, and, foremost, it is dependent on temperature.

The most expensive crystal oscillators have their crystal in an oven at regulated constant temperature (oven controlled crystal oscillator, OCXO). The cost of such an oscillator would be a significant part of the total component cost of a small base station, at least for the smallest units, the so-called femtocells, which can serve only a few mobile phones, e.g. in homes.

A less expensive way of increasing oscillator stability is to add circuitry that automatically compensates for changes in the temperature (temperature compensated crystal oscillator, TCXO).

Such temperature compensation is not perfect. Some temperature dependency remains, since the compensation circuitry cannot achieve the exact characteristic that would typically be needed, and since component values are slightly different in different units. Also, aging is still a problem. An ordinary TCXO is therefore not sufficiently stable.

Traditional time distribution uses a clock function that emits a time signal, e.g. a pattern of pulses at regular intervals. This may be accompanied by messages stating the time of day, or equivalent information related to the time signal. Automatic receiving stations can use the time signal and associated data for synchronization of their local clocks.

Communications now increasingly use packet switching, both locally and globally. Data to be transferred is then divided into packets, which are transferred through a network where they are sharing communication links with other traffic and may be delayed by varying amounts of time. The delay variations severely limit the synchronization accuracy unless special methods are used to compensate for them.

The stations may be computers or embedded digital control systems, in which case software in the station can be used for the control of the synchronization process. This software could contain functions for receiving and interpreting the time information and adjusting for any errors or inaccuracies in the data transfer. The software would be responsible for using the received time information for adjusting the setting and the speed of the local clock so that it, as well as possible, is synchronized with the clock that produced the time signal. There would also be software functions that enable the use of the local clock. If there is a local operating system and application programs, these should have the access they need to the local clock time value. There might also be hardware interfaces directly controlled by the local clock, in order to make things happen at more precise time than would be possible with software control. As an example there might be logic circuitry that regenerates a precise time signal, to be used by some local hardware device.

The generation of timing signals and distribution of time via networks is generally applicable in many different technical applications. For example, distribution of time is useful for computers connected to Internet. For some other kinds of network nodes higher accuracy may be needed. One example is in the field of industrial automation, where digitally controlled factory machines may need to work together. Another important area is telecommunication infrastructure, e.g. base stations for mobile telephony, where the different units must be well synchronized, and the radio frequencies they synthesize have to maintain a high accuracy.

For example, consider a "master" unit, equipped with a stable clock, which is perhaps kept accurate by a 1 pps (pulse per second) time signal from a GPS (Global Positioning System) receiver. The master distributes its time information over a packet network, e.g. one using the Internet protocol (IP), to slave units. See FIG. 1.

The Network Time Protocol (NTP) is a standard protocol for such time distribution, and IEEE 1588 is a new standard protocol for more precise time distribution, with the aim of reaching an accuracy of a fraction of a microsecond.

Typical for packet networks is that packets are delayed on the way from sender to receiver. The IEEE 1588 protocol can adjust for this, because it includes a method for measuring the delay time, based on the assumption that it is the same in both directions. There are normally some fluctuations in the delay time, and the control algorithm should compensate for that by implementing a suitable filter characteristic in its control loop, averaging the normal fluctuations and disregarding erroneous data and any occasional abnormal delays that may occur due to e.g. collisions, in a network with intermediate buffering of packets.

The basic synchronization protocol according to IEEE 1588 is schematically illustrated in FIG. 2. The master sends "sync messages" to the slave, each one followed by a "follow-up message", which includes a "timestamp" that tells the slave what time the master's clock showed when the sync message left the master. The slave timestamps its reception of the sync message, and calculates the difference between the timestamps for reception and transmission. That difference should on average be constant if the slave clock has the same speed as the master clock. If the difference tends to increase or decrease, then the slave should adjust the speed of its clock to counteract the trend, so that the average difference stays constant.

This average difference should be equal to the average delay time. The slave regularly measures the delay time by sending a "delay request" message to the master. The slave timestamps the sending of this message and the master timestamps the reception and the master then sends, in a "delay response" message, its timestamp to the slave. Using these timestamps and those from the sync message transmission and reception, the slave then calculates the sum of the forward and backward delay measurements. Any error in the slave's own clock time gets cancelled out in this calculation, since it would have opposite sign in the two differences that are added together. The sum is then divided by 2 to get a result that would be the actual delay time if the delays, including random fluctuations, were equal in both directions. From this value, which is the desired difference between slave timestamp and master timestamp of each sync message, the previously measured difference for the sync messages should be subtracted in order to obtain the correction that should be added to the slave clock (a positive correction should move its time forward). Usually the corrections are filtered before being applied, in order to even out the random jitter. Also, non-typical values, caused by less common collision events on the network, may be omitted or given lower weight in an averaging filter. If the resulting correction value is negative the slave decrements or retards its clock, and if the correction value is positive it advances its clock, until the average difference for the sync messages becomes equal to the measured difference for the delay request messages (and thereby also to the calculated actual delay time. Two feedback loops are used: One uses only data from the more frequent sync messages and controls the speed of the local clock, essentially trying to keep the measured master-to-slave delay constant. The other, which has a much slower regulation, uses also the less frequent delay request measurements, and controls the phase of the clock, so that it not only has the same speed as the master clock but also shows the same time. Note that changing the speed will in time change the time value compared to the master, and that it may therefore be sufficient to regulate only the speed. A change of the phase is then accomplished by intentionally running the frequency a little too high or too low until the desired phase change has been obtained. This way the local precise time will have the sometimes important property of being monotonous, with a rate of change that can vary only within given limits.

If no special hardware is used, the normally unpredictable delays in the software in master and slave are part of the uncertainty in the over-all path delay. The IEEE 1588 standard describes, however, a way to eliminate that part of the uncertainty, by doing the time stamping at the physical interface. See FIG. 3, which illustrates a layered representation of the master and slave. PHY represents the physical layer and is the electrical interface, typically where analog signals are generated and decoded, respectively, when transmitting and receiving. MAC is the Media Access Control layer, typically a digital hardware subsystem, and the layers above are software. IP (Internet Protocol) and UDP (User Datagram Protocol) are parts of the standard packet communication protocol used e.g. on the Internet, and PTP is the special Precise Time Protocol specified by IEEE 1588. The delay time through the software typically depends on many things, also on unrelated activities that share the processor's time, and will vary unpredictably. Special time stamping hardware registers the time when the SFD (Start of Frame Delimiter) byte passes from MAC to PHY (on transmission) and from PHY to MAC (on reception), and passes the registered timestamps of the IEEE1588 frames up to the PTP protocol software.

In these systems, a clock generally consists of a sufficiently stable oscillator and some kind of hardware counter that is advanced by the oscillator. The oscillator frequency needs to be high in order to obtain the fine precision typical of IEEE1588-based systems: a precision of 10 ns requires a frequency of 100 MHz. The counter can be a simple counter, i.e. one which, for every cycle, changes by 1 in its least significant bit position, arranged to directly show the time in the desired format, e.g. in units of 8 or 16 nanoseconds if a binary nanosecond value is needed.

This could be done by having a controllable oscillator, which could be controlled, by the protocol feedback loop, to have exactly the desired frequency, e.g. 1,000 MHz/8=125 MHz. For this high frequency, the oscillator would probably be replaced by a lower-frequency oscillator followed by a phase-locked loop (PLL). The requirement for variable frequency may increase the cost for low-cost slave systems, and may be difficult to combine with high stability requirements for master clocks.

An alternative, which is used by some equipment makers, is to use a clock signal source consisting of a fixed frequency oscillator, or a combination of a fixed frequency oscillator and a PLL, and let the counter consist of an accumulator register, an adder, and an increment register, and add the increment register contents to the accumulator register in every cycle of the clock signal. This solution is sometimes referred to as an adder-based time generator. The increment value can then be adjusted instead of the oscillator frequency. Very small adjustments must be possible. If an adjustment step down to one billionth (1 nanosecond per second) is required, then the increment must have at least 30 fraction bits, i.e. bit positions to the right of the binary point. A disadvantage is the power consumption of this wide hardware operating at this high frequency.

U.S. Pat. No. 7,024,579 relates to a configurable timing system having a plurality of timing units interconnected via software programmable registers to perform a count operation.

U.S. Pat. No. 7,292,109 relates to an auto-calibrated time base apparatus.

US 2007/0291676 A1 relates to a mobile radio terminal with a system for maintaining autonomous system clock accuracy.

U.S. Pat. No. 6,157,957 relates to a clock synchronization system and method using a continuous conversion function for a communication network.

GB 2,392,353 relates to a method and apparatus for distributing timing data across a packet network.

US 2002/0176194 A1 relates to a high-speed programmable synchronous counter for use in a phase-locked loop.

As mentioned, with IEEE 1588 a time-stamped sync message is received at regular intervals, and these time stamps are used as input to a digital servo loop (PI controller) to synchronize a local clock, thereby producing "precise time" in nanoseconds. The IEEE 1588 protocol allows the measurement of delay time from the "master" (the time server that sends the sync messages) to the "slave", i.e. to the receiving base station, and that delay time is taken into account when disciplining the local clock.

Synchronization input from GPS is a pulse every second, accompanied with information on "time of day" valid for that pulse. These pulses can be used for disciplining the local clock, using the same or a similar servo loop. Even though the GPS pulses could be used more directly for the purpose described below, the PI controller will improve the result by reducing the effect of jitter in the GPS signal. Therefore it is assumed in the following that a disciplined local precise time clock is used even if/when synchronization is received from GPS. This will also permit the use of other synchronization sources that, like GPS, might have periods of unavailability.

If an E1/T1 line is available—even if not used for the data traffic—then that can be used instead of GPS. Time pulses would then be generated from the E1/T1 signal by logic circuitry, and used to discipline the local precise time clock.

Still another possible source of timing could be a receiver and demodulator for GSM (Global System for Mobile Communications) downlink from the nearest GSM base station (a fixed, bigger base station, i.e. a macrocell, not the small kind of device that would use the local precise time clock that is to be synchronized here). Using this for precise time synchronization would require knowledge of the delay time for the radio waves between transmitter and receiver, i.e. of the distance between them. This would not be required if the synchronization is needed only for keeping correct local oscillator frequency.

When synchronization is received, the local clock has very good long-term stability—it does not drift away, as a local clock would do without synchronization if it were driven by a free-running oscillator.

The oscillator that is used for the local clock can be free-running (always) or it can be controlled by a processor—in this case we assume it is the same processor that handles IEEE 1588 and/or GPS.

In the first case it is common to use the oscillator (perhaps indirectly, via a PLL that increases the frequency) to clock a digital circuit that in each cycle adds the contents of a register to an accumulator register. The accumulator contents represent the precise time. Let's assume this is in nanoseconds (as in the IEEE 1588 standard). The first register contains an increment, which should be equal to the length, in nanoseconds, of each clock period. The increment has many extra fraction bits, and the processor can change it and make the increment slightly more or less than the nominal clock period, in order to compensate for a error in the oscillator frequency an/or to speed up or slow down the clock temporarily to adjust the local precise time. In this way the local "precise time clock" can be disciplined. The servo would thus control the contents of the increment register.

In the second case the servo controls the tuning input of the oscillator, and the increment is fixed.

When synchronization (by any of the methods above) is lost, the servo cannot calculate any error to compensate for. The precise time clock will start to drift away as soon as the oscillator frequency does not have exactly that frequency it must have for the clock to show correct time. If there is a frequency error there will be an increasing time error.

SUMMARY

A basic idea is to provide an electronic time or timer system having a counter-based time generator for continuously and directly generating raw base time, and a translator, to be used when needed, for translating between raw base time, denoted $t_r$, and local precise time, denoted $t_p$, of the timer system. The translator is preferably configured for operation based on the following relation:

$$t_p = A \cdot t_r + B,$$

where A and B are configurable parameter values.

This novel design enables simple and cost-effective practical implementations, and also supports power effective operation of the timer system.

In a first exemplary aspect, the timer system can be used for generating local precise time by capturing a raw base time value from the counter-based time generator in response to an external event such as a trigger pulse and, if needed, using the translator to calculate local precise time from the raw base time value and the parameter values A and B.

Whether or not the translation need be done may depend on conditions, e.g. on contents of an Ethernet frame that has been time stamped.

In a second exemplary aspect, the timer system can be used for generating a precisely timed output signal by defining precise time of a desired timing event, then using the translator, with the current parameter values A and B, to calculate a coincidence value as a corresponding raw base time value based on the defined precise time, and generating the timed output signal (a transition in the output signal) when (in the cycle in which) the value of the continuously generated raw base time of the counter-based time generator is equal to the calculated coincidence value.

In a further development, the present invention increases the time a base station or similar apparatus or device can operate without receiving synchronization. It can be used with any kind of oscillator, such as OCXO or TCXO or a simple uncompensated crystal oscillator.

If synchronization is provided through GPS, a processor is usually involved. This is also usually the case if IEEE 1588 is used. If the system is designed such that either of these methods can be used, then these functions could be performed by the same processor, or by different processors. In an exemplary embodiment, it can be assumed that it is the same processor, even though that is not important for the invention.

The processor can be equipped with a program which, when the synchronization source, i.e. time pulses from GPS, is lost, will turn to some other source of synchronization, if available. A source that can only provide accurate frequency (not absolute time) will then be sufficient, if the local clock already has correct time from when e.g. GPS was available.

A temperature sensor is placed in the vicinity of the oscillator or the crystal used by the oscillator, i.e. near or in contact with the oscillator or the crystal. A processor monitors a variable TV derived from the sensor and thus representing the temperature. In an exemplary embodiment, it can be assumed that it is the same (although not necessary) processor that is also is used for IEEE 1588 and GPS. When the system is synchronized in a so-called data acquisition and table construction phase, the temperature is sensed at different occasions. Each temperature reading is normally digitized by an A/D-converter and the digital temperature value is then converted/quantized into a suitably quantized temperature value TV, preferably for addressing a cell in a look-up control table in memory for storing an associated control variable CV representative of a current frequency control output variable used for controlling the frequency.

When synchronization is lost, the system switches from the data acquisition and table construction phase to a so-called table-based control phase. In this phase, a temperature value is read from the sensor and converted into quantized form as a quantized temperature value TV, which can be used to extract a corresponding control value CV from the previously constructed look-up table in memory. The extracted control value CV is then used as the frequency control output of the synchronization system.

As an example, with the present invention it is proposed to store the above parameter A as the control value CV during the data acquisition and table construction phase, and use the extracted control value CV from the look-up table as A in the above formulas for generating local precise time or for the purpose of generating a precisely timed output signal during the table-based control phase. More generally, the control values stored in the look-up table are representative of the parameter value A, and when no synchronization source is available, the parameter variable A is configured based on an extracted control value.

The invention with the integrated design of look-up table based time-synchronization using a temperature sensor is especially applicable in a base station.

BRIEF DESCRIPTION OF DRAWINGS

The invention, together with further objects and advantages thereof, will be best understood by reference to the following description taken together with the accompanying drawings, in which.

DETAILED DESCRIPTION

An electronic clock (i.e. a time or timer system) traditionally either has a high-frequency oscillator and a counter, with adjustable frequency and phase (i.e. time), or an adjustable increment, typically with a long fractional part, and an adder that with a fixed (not controlled) frequency adds this increment to an accumulator register. In the invention, the local clock can be adjusted without changing the oscillator frequency. Also, the invention enables the use of a simple counter that steps (up or down) by 1 for each cycle.

An electronic time or timer system according to a preferred exemplary realization comprises a counter-based time generator for continuously generating raw base time, and a translator for translating between raw base time and local precise time. Preferably, the translator is configured to operate according to the following relation:

$$t_p = A \cdot t_r + B,$$

where local precise time of the timer system is denoted $t_p$, raw base time of the timer system is denoted $t_r$, and A and B are configurable parameter values controlling the local clock. For example, A controls the speed of the local "virtual" clock and B controls the setting of the current time.

Figure 1:
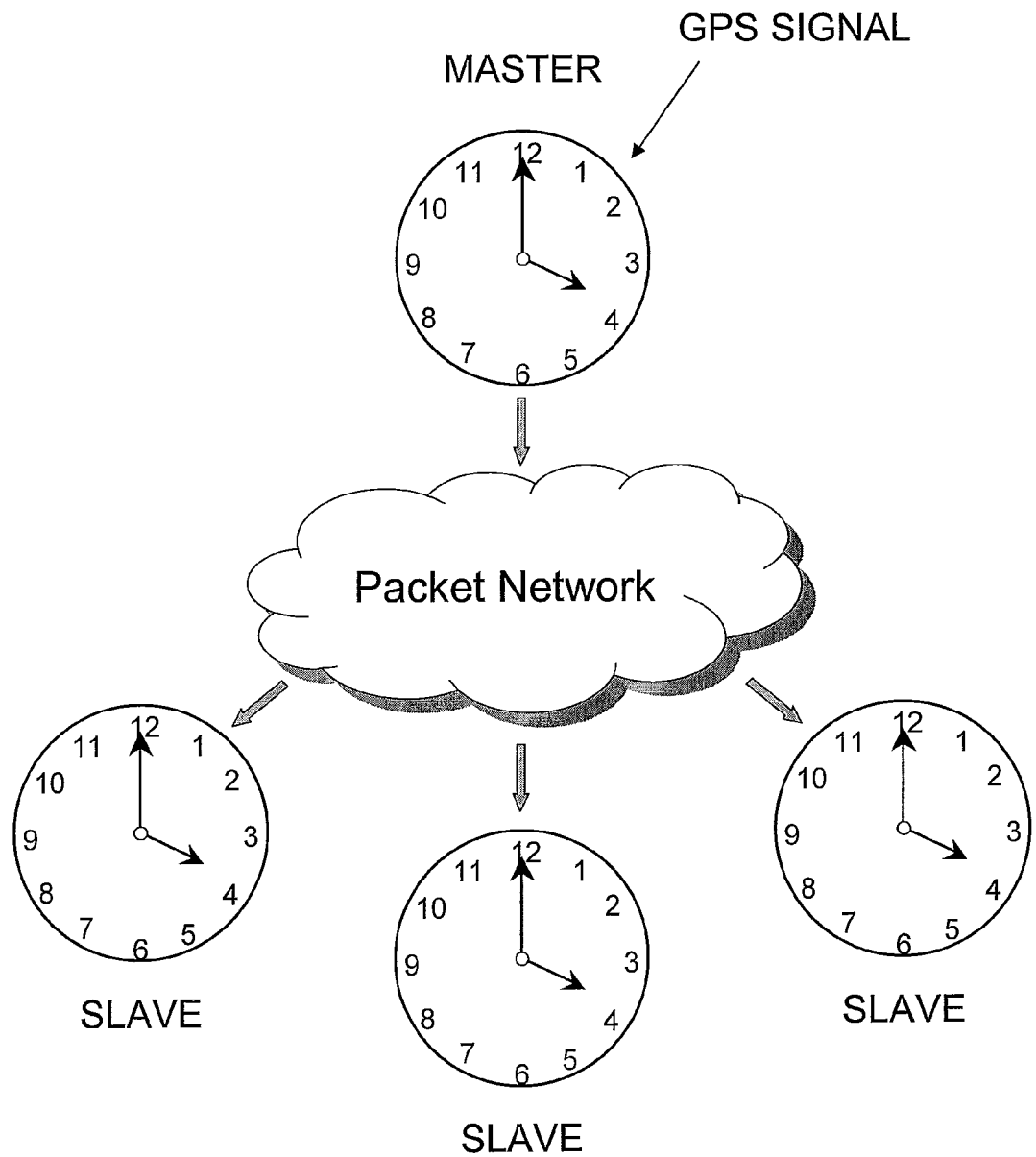
FIG. 1 is a schematic diagram illustrating an example of time distribution in a master-and-slave setting.
Figure 2:
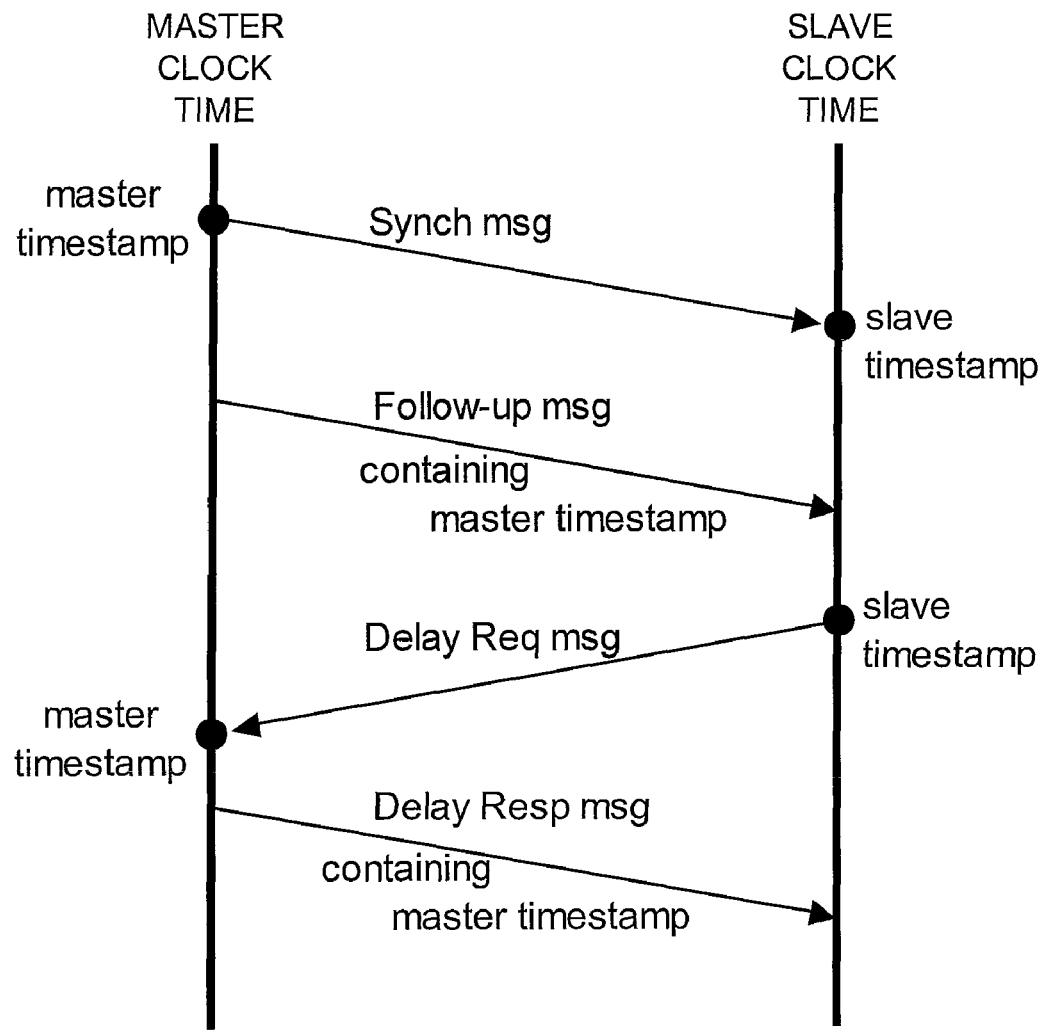
FIG. 2 is a schematic diagram illustrating the basic synchronization protocol of the IEEE 1588 standard.
Figure 3:
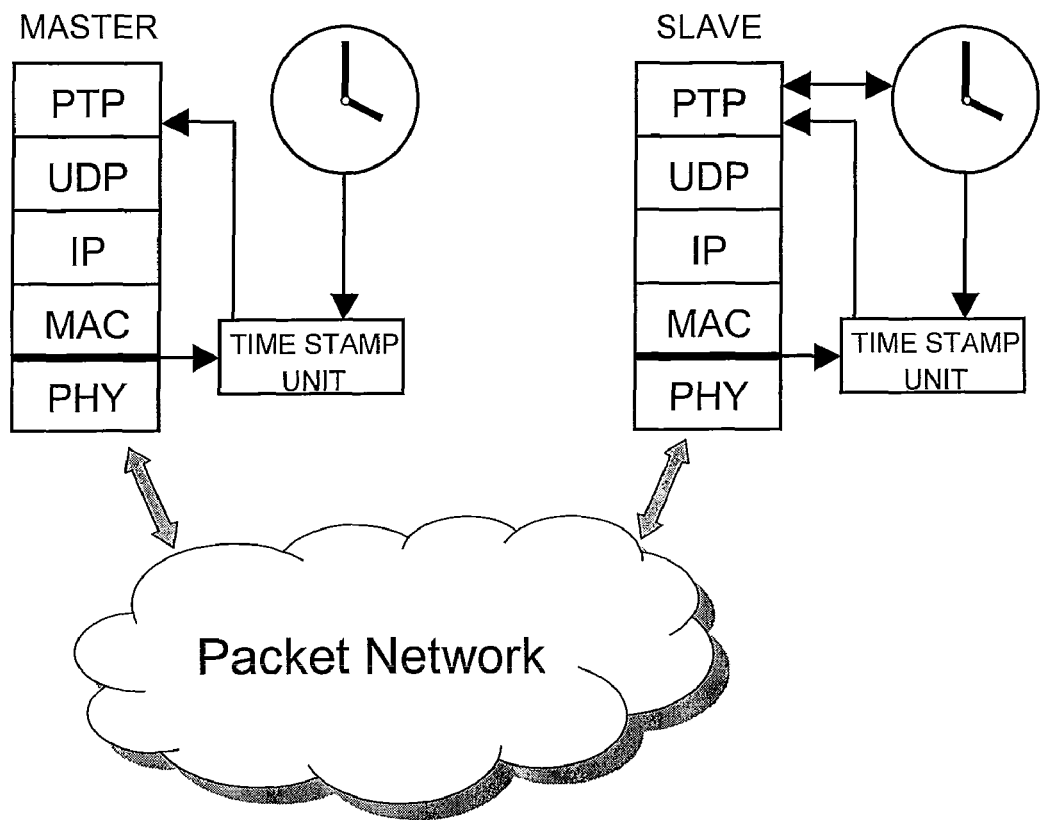
FIG. 3 is a schematic diagram illustrating a layered representation of master and slave in a time distribution system.
Figures 4A, 4B:
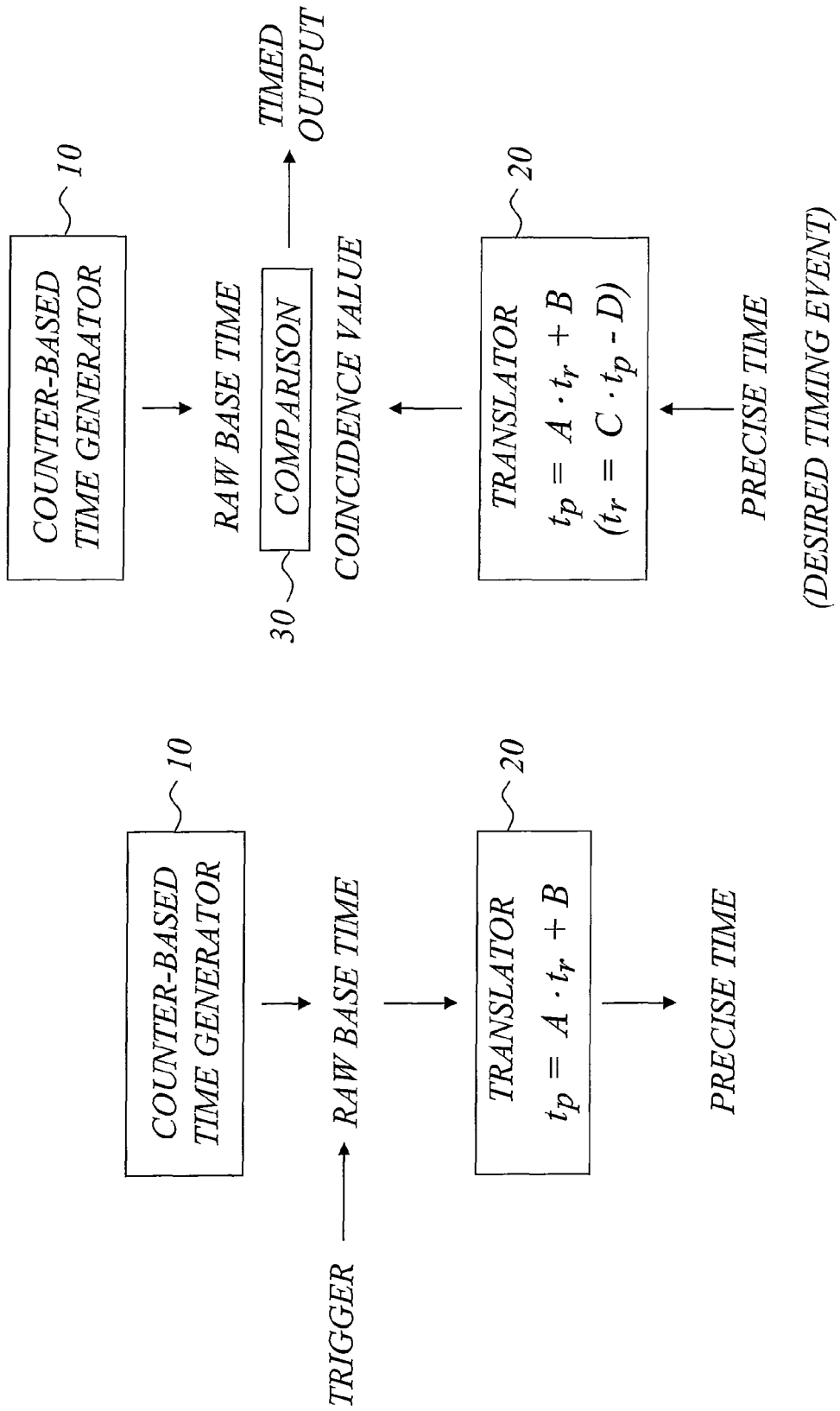
FIG. 4A is a schematic diagram illustrating an electronic timer system according to a preferred exemplary embodiment of the invention used for generating precise time from raw base time.
FIG. 4B is a schematic diagram illustrating an electronic timer system according to a preferred exemplary embodiment of the invention used for generating a timed output signal.

FIG. 4A is a schematic diagram illustrating an electronic timer system according to a preferred exemplary embodiment of the invention used for generating precise time from raw base time. In this situation, the timer system is configured for capturing a raw base time value from the counter-based time generator 10 in response to an external event such as a trigger pulse TRIGGER. The translator 20 of the timer system takes the captured raw base time value as input together with the parameter values A and B to generate local precise time.

FIG. 4B is a schematic diagram illustrating an electronic timer system according to a preferred exemplary embodiment of the invention used for generating a timed output signal. In this situation, the translator 20 takes a defined precise time of a desired timing event as input together with the parameter values A and B to calculate a so-called coincidence value as a corresponding raw base time value. The coincidence value generated by the translator 20 is then continually compared in a comparator 30 to the value of the raw base time of the counter-based time generator 10. A timed output signal is generated when the value of the continuously generated raw time base of the counter-based time generator 10 runs equal to the calculated coincidence value.

From the given relation between raw base time and precise time, the raw base time can be expressed as:

$$t_r = (t_p - B)/A.$$

This may be re-written as:

$$t_r = t_p/A - B/A = C \cdot t_p - D,$$

where $C = 1/A$ and $D = B/A$.

In a preferred exemplary embodiment, the expression $t_r = C \cdot t_p - D$ is used in the practical implementation because multiplications are much faster to execute than divisions. The parameters C and D are calculated based on the parameter values A and B and stored for usage as and when needed. They are normally high precision numbers.

The unique design principle proposed by the invention allows for simple and cost-effective implementations and also allows for power-efficient operation of the timer system.

For example, the translator may be implemented by program code in a suitable processor, preferably using existing arithmetic resources of the processor. Preferably, although not necessarily, the entire timer system may be implemented on a single microcontroller chip. For example, a microcode-programmed processor may be used, and the microcontroller chip then preferably includes a microcode-programmed processor having a processor core and micro program memory for the microcode. In a preferred implementation, the lowest level of programmed control, the level closest to the hardware and most time critical, is executed by dedicated microcode in a microcode-programmed processor (e.g. the MAC logic and time stamping). It should though be understood that different implementations of the timer system of the invention are possible, using any suitable combination of software and hardware logic.

The present invention uses a new and truly unique principle. It allows the use of an inexpensive oscillator, which does not have to be adjustable, and only requires very little hardware that needs to operate at high frequency.

No dedicated adder has to be used. Instead the ordinary arithmetic resources of the processor can be used for the calculations that are needed.

Figure 5:
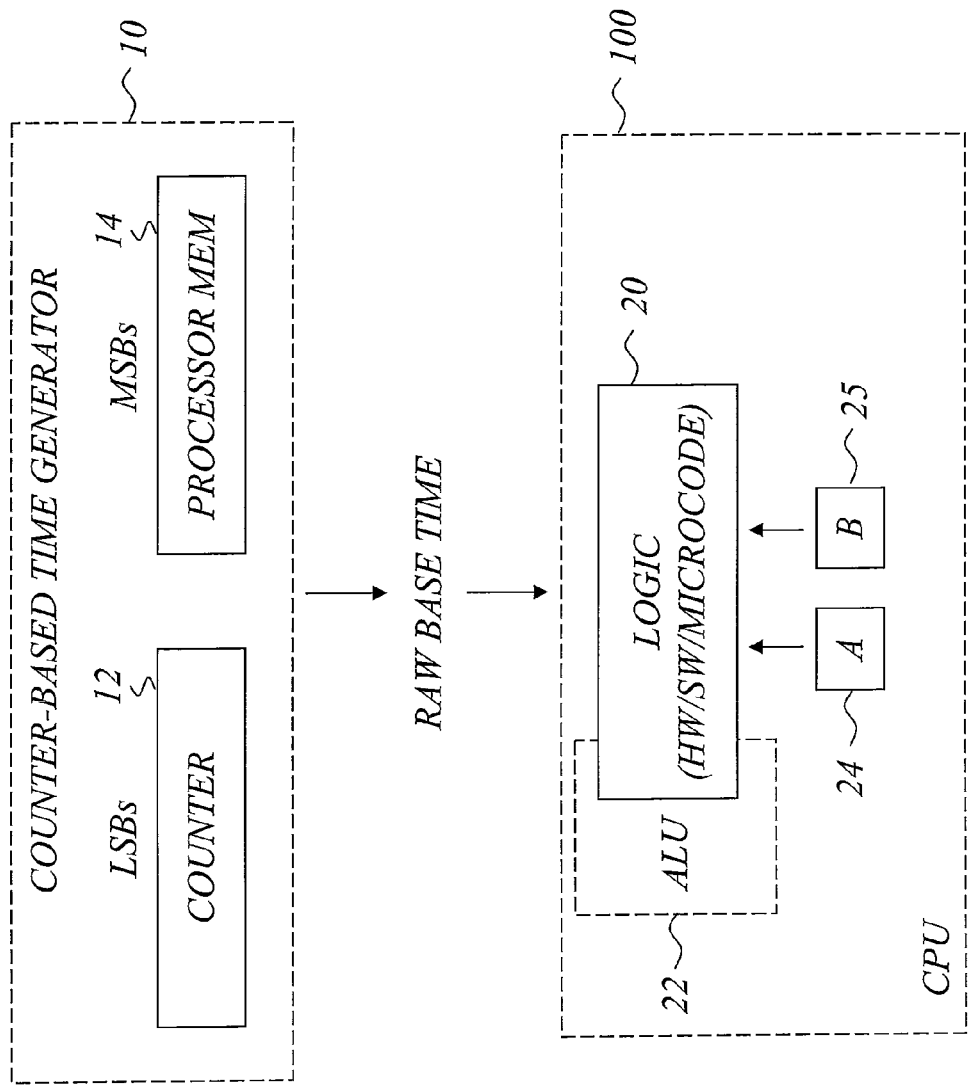
FIG. 5 is a schematic block diagram illustrating a specific exemplary implementation of a timer system according to a preferred embodiment of the invention.

A hardware counter is generally needed, but only the simplest kind of counter is required, which need not be set and which simply increments/decrements by 1 in each oscillator cycle. Of course, more advanced counter-based time generators may be used, but the invention makes it possible to use very simple counters. In a preferred implementation this counter is also relatively short; a continuation for the more significant bit positions may be kept in memory, as schematically illustrated in the example of FIG. 5.

Thus, the counter-based time generator 10 may be based on a hardware counter 12 for the less significant bits (LSBs) of the raw base time in combination with a continuation of the raw base time for the more significant bits (MSBs) in memory, such as the memory 14 of the processor. The hardware counter 12 is normally driven by an oscillator (not shown), and typically the continuation of the raw base time in memory 14 is regularly updated when the counter wraps around (i.e. when the counter sequence starts over again).

The counter, including its more significant continuation in memory, is typically said to contain "raw time". The clock function of the exemplary implementation of FIG. 5 preferably includes a combination of hardware and software. As mentioned, the logic 20 may advantageously be implemented in microcode, although other software realizations (as well as pure hardware realizations) are possible.

A characteristic of an exemplary embodiment of the invention is that the "software" controls neither the oscillator frequency nor the contents of the counter. Instead the logic 20 (software and/or hardware) is controlled by two parameter values, which define the relation between raw time and precise time, and which are modified when the speed or time value of the local precise time clock needs to be changed. Such translations are done only when needed, which is relatively infrequent and can be performed by the processor's standard resources. In this way it is possible to reduce the power consumption of the timer system, compared to prior art solutions. Note that the local precise time clock is a virtual clock, in the sense that it is not continuously accessible; its time value has to be calculated when needed. In other words, the translator is triggered on-demand As an example, a software program may use the IEEE 1588 principle to measure the frequency and phase errors, filter them and combine them as described above, and thus calculates, at more or less regular intervals, a desired frequency change, which is to be applied to the virtual local precise time clock by changing the parameter values. Note that in this particular example A and B must both be changed, together, for the local precise time to be monotonous. A is adjusted to get the desired "speed" ratio between raw time and local precise time, and B is then changed so that $t_p = A \times t_r + B$ (with $t_p$ and $t_r$ at the time of the change) has the same value after the change as it had before it.

The hardware, which includes the counter 12, can be part of a microcontroller chip, which also executes the software part of the clock function. Also preferred characteristic for this exemplary solution is that the special features required by the hardware timer are of a general kind and usable also for other microcontroller applications.

In a preferred exemplary embodiment, two registers 24, 25 hold parameters, called A and B, and the logic 20 can translate between raw time and local precise time as and when needed. When the translator logic 20 is implemented in microcode or other suitable program code, an efficient implementation option is to use existing arithmetic resources such as the Arithmetic Logic Unit (ALU) 22 of the Central Processing Unit (CPU) for the calculations.

Figure 6:
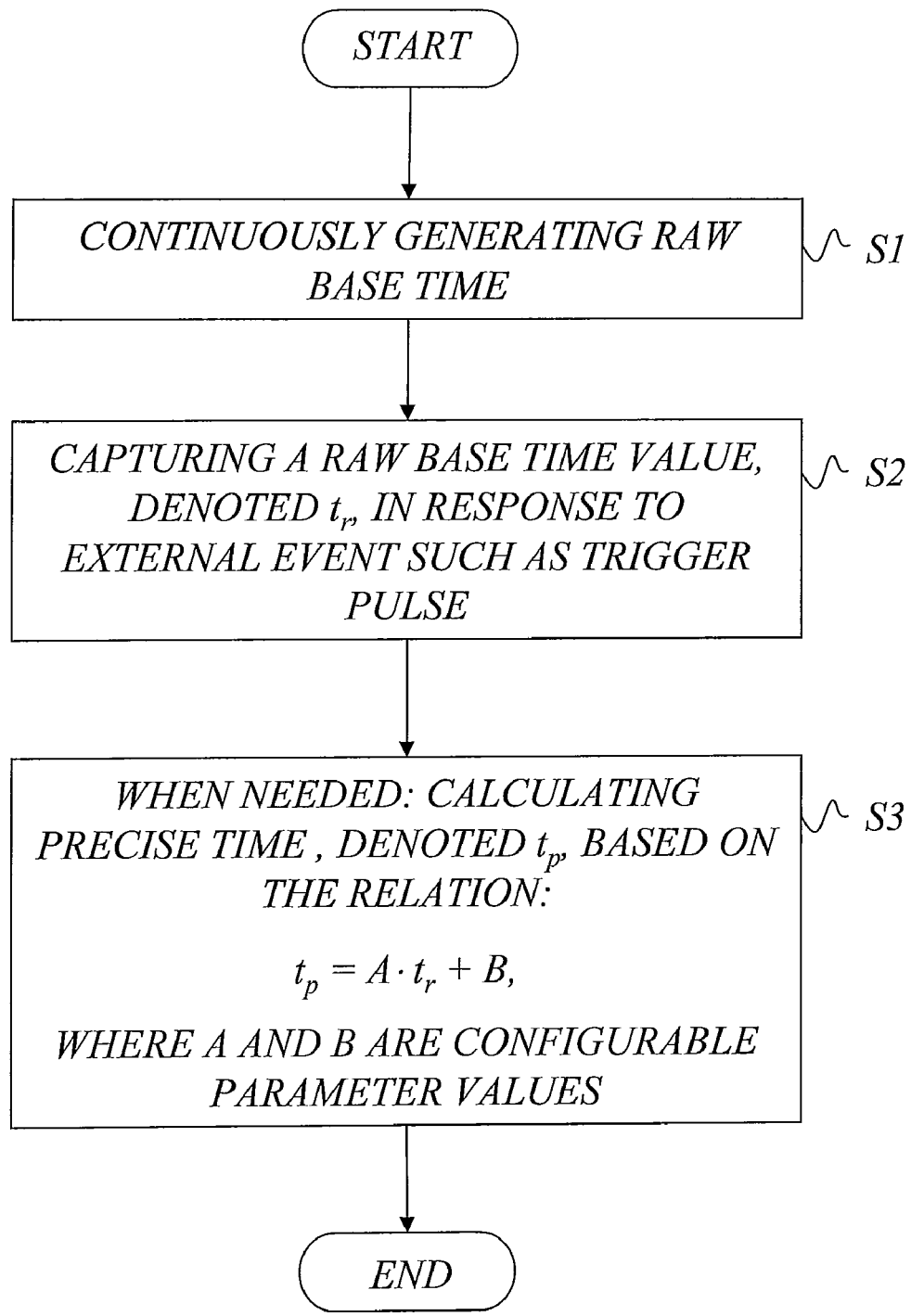
FIG. 6 is a schematic flow diagram of a method for generating precise time according to a preferred exemplary embodiment of the invention.

FIG. 6 is a schematic flow diagram of a method for generating precise time according to a preferred exemplary embodiment of the invention. As indicated in step S1, raw base time is generated on a continuous basis. In response to an external event such as a trigger pulse, a raw base time value is captured, as indicated in step S2. As indicated in step S3, the clock function can then calculate:

$$t_p = A \cdot t_r + B,$$

where $t_r$ is the captured raw time provided by the counter-based time generator. The result $t_p$ is the local time of the clock, the precise time it would report as a response if an application program would issue a call to get the time. Preferably, the calculation is, however, only performed when needed, i.e. for most of the time this local precise time is only "virtual".

Setting the time is preferably done by changing the contents of the parameter register B. Adjustment of the clock speed is done basically by changing the contents of the parameter register A. It is, however, normally necessary to also adjust B when A is changed; otherwise the current (virtual) time value will change.

Figure 7:
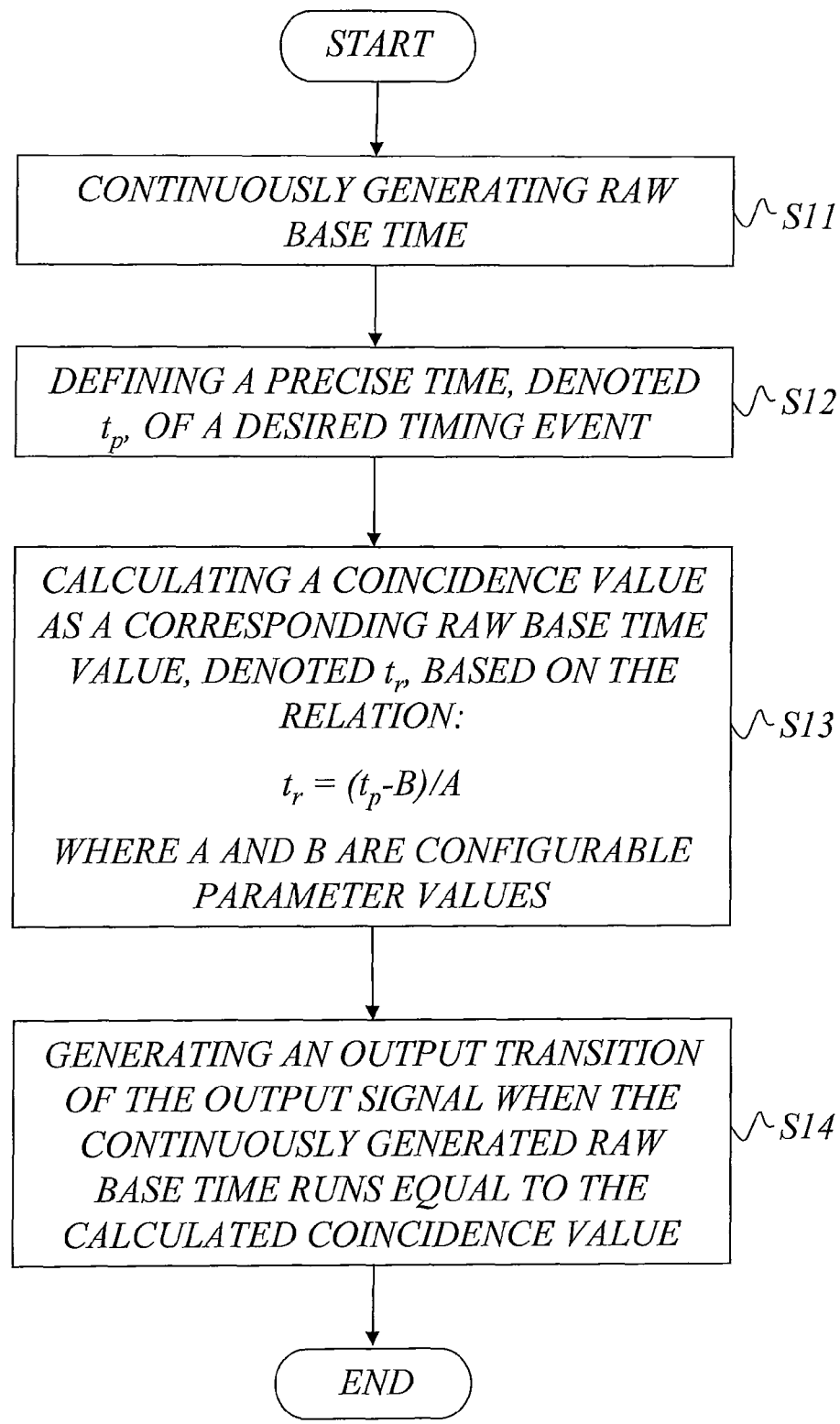
FIG. 7 is a schematic flow diagram of a method for generating a precisely timed output signal according to a preferred exemplary embodiment of the invention.

FIG. 7 is a schematic flow diagram of a method for generating a precisely timed output signal according to a preferred exemplary embodiment of the invention.

A timed output signal is generated in the following way. As indicated in step S11, raw base time is generated on a continuous basis. A precise time $t_p$ for a desired timing event such as the next output signal transition (e.g. the start of a pulse) is determined in step S12. Then this is converted to raw time in step S13 by calculating:

$$t_r = (t_p - B)/A.$$

As previously indicated, for efficient implementation, raw time is preferably calculated as $C \cdot t_p - D$, where $C = 1/A$ and $D = B/A$. The parameters C and D are typically pre-calculated and stored so they can be used several times. This means that multiplications rather than divisions are executed when calculating raw time values. The parameters C and D may be updated when the parameters A and B are changed, or the first time they are needed after A and B have been changed.

Then the $t_r$ value is loaded into a coincidence register. The coincidence register is connected to a comparator that continually compares it with the raw time counter, and when they are equal (i.e. at coincidence) the logic executes the needed output transition as indicated in step S14. An interrupt request may also be generated, indicating that the logic can now calculate and load the next coincidence value.

As mentioned, the invention is generally applicable for time control and/or for generating timed output signals. For example, the proposed timer system may be configured for time distribution applications such as Network Time Protocol (NTP) and IEEE 1588 Precise Time Protocol (PTP) applications.

Figure 8A:
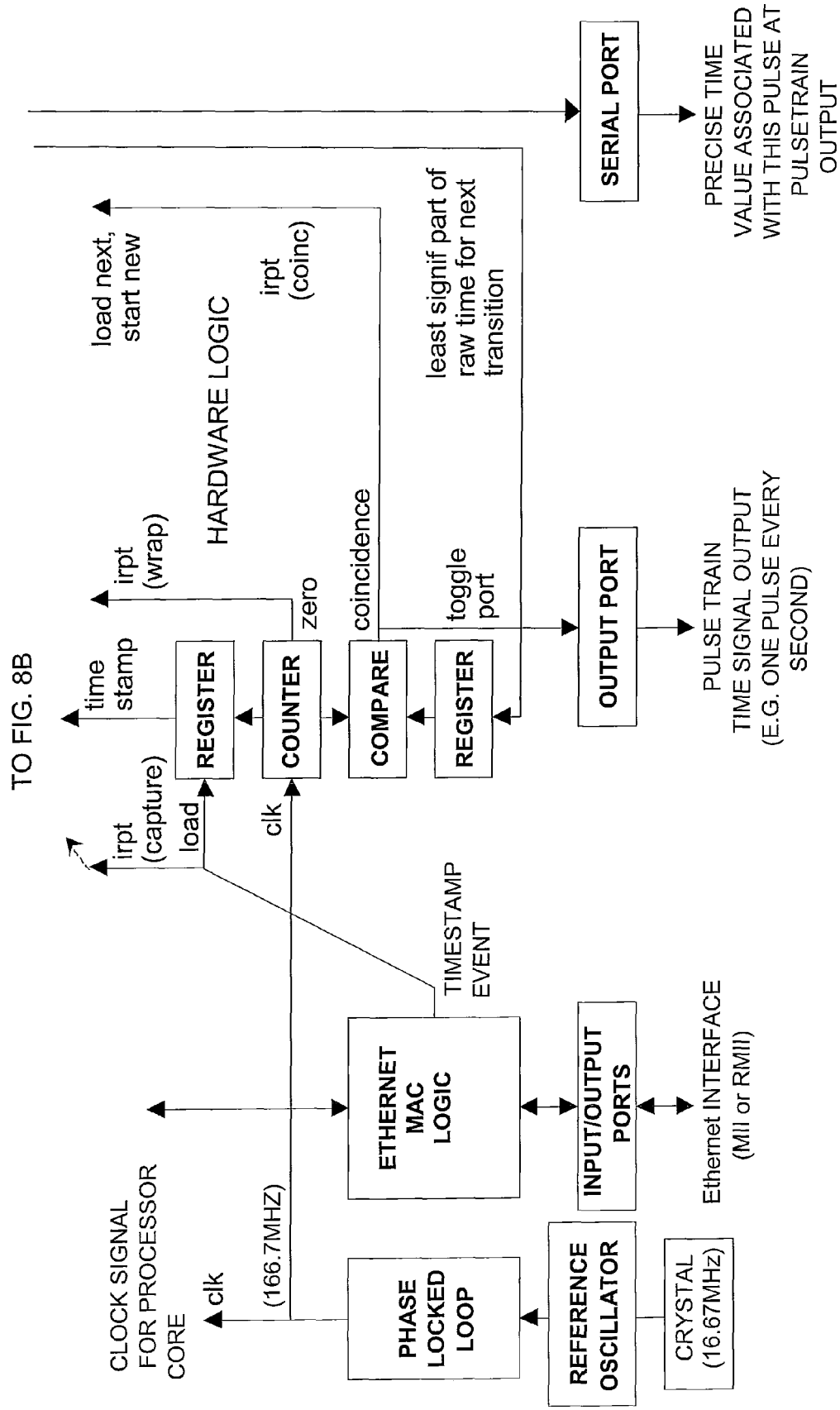
FIGS. 8A-B are schematic diagrams that together illustrate an example of a combined hardware/software system that can be used for time distribution applications.
Figure 8B:
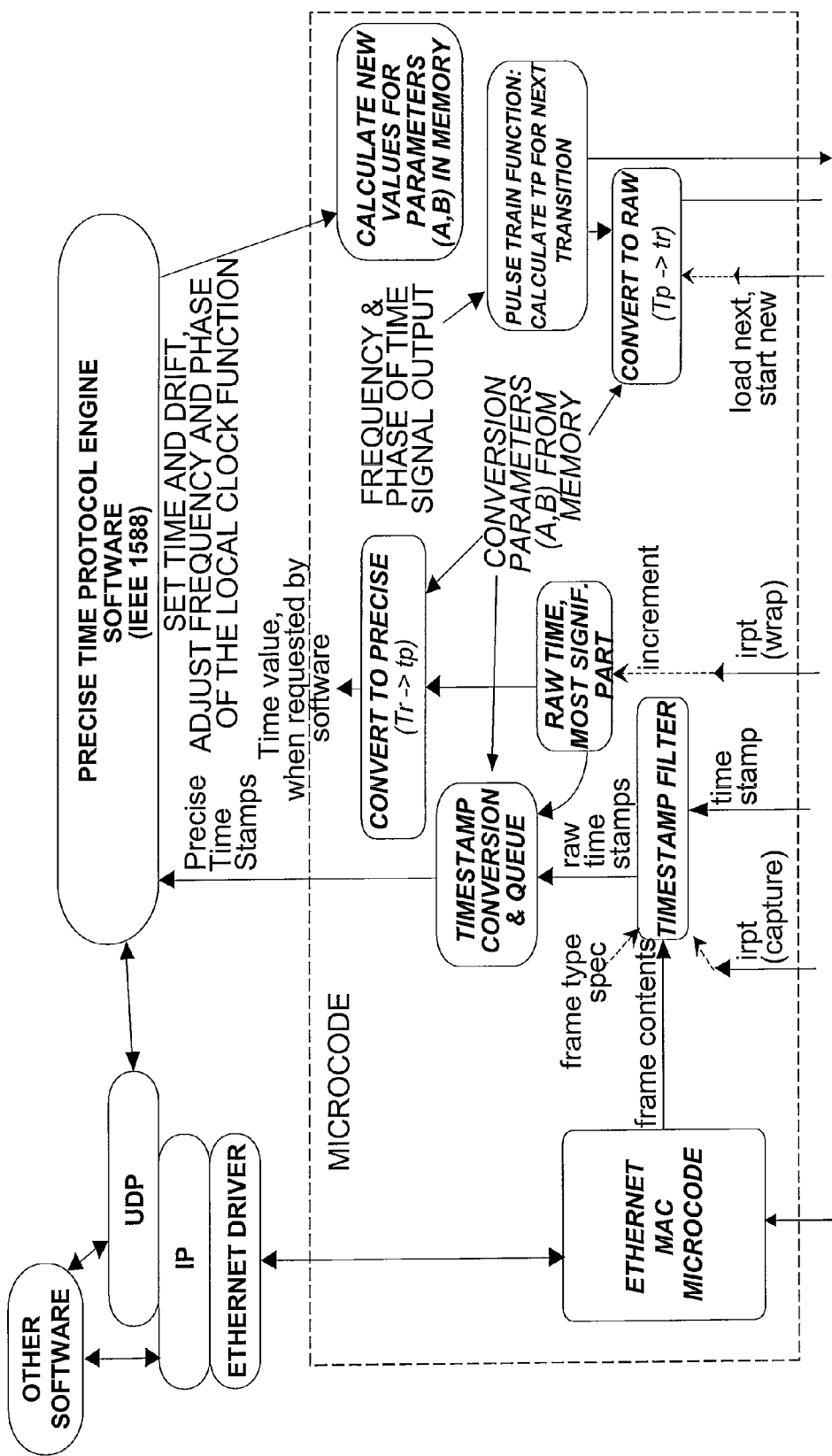

FIGS. 8A-B are schematic diagrams that together illustrate an example of a combined hardware/software system that can be used for time distribution applications. FIG. 8A mainly indicates the hardware logic part of the overall system, and FIG. 8B mainly indicates the software part of the system. The hardware part is based on an oscillator-driven counter and associated registers and a comparator. The counter is for example driven at 166.7 MHz by a reference oscillator via a phase-locked loop. The communication stack is preferably based on Ethernet/UDP/IP, the synchronization is PTP (Precise Time Protocol) engine software, and the microcode (e.g. the time stamp filter) is preferably adapted to IEEE 1588.

Instead of driving the counter at 166.7 MHz and using a 16.67 MHz crystal, other clock frequencies and crystals may be used. For example, the crystal may be a 20 MHz crystal and the clock frequency 200 MHz. It is also possible to use a pre-scaler which down-converts the clock frequency by a factor N (e.g. down-converted 4 times from 200 MHz to 50 MHz).

In the following an implementation according to a particular exemplary embodiment of the invention will be described:

In this particular implementation a microcode-programmed processor is used, which is useful to reach high precision at low power consumption but is not a requirement.

In general, a microcode-programmed processor is a processor in which the general standard operation of the processor is controlled by sequences of microcode words in an internal micro program memory. This should not be confused with the expression "microprocessor", which simply means that the processor is built as an integrated circuit. Naturally, a microcode-programmed processor may also be built as an integrated circuit, but a microprocessor is not by definition equipped with a micro program for controlling its internal operation.

The microcode program, and parts of it, is sometimes simply referred to as microcode. As is normal for microcode-programmed processors (sometimes called CISC processors, for Complex Instruction Set Computer), the instructions defined in the instruction repertoire, or ISA (Instruction Set Architecture) of the processor are executed by microcode in internal ROM (read-only memory) in the processor. In the processor used in this particular implementation, a part of the microcode memory is a writable RAM (random access memory), which is an advantage and an enabler for special functions but not a requirement.

In this preferred implementation, a configurable timer system is used. It may include several timers and is part of a microcontroller chip which also contains the processor core with its micro-program memory.

The lowest level of programmed control, i.e. the level closest to the hardware and most time critical, is preferably executed by dedicated microcode. An example is the Ethernet MAC layer (except for a part of it which is dedicated hardware). The time stamping is also an example.

The next level of programmed control is in machine code, i.e. program code in the main memory (external to the processor), comprising instructions defined in the ISA and developed in assembly language. The top level is also machine code, although it has been developed in high-level language. For example, the logic for the actual translation may be implemented in assembly code.

In a further example, still referring to FIGS. 8A-B, a 10-bit counter repeatedly counts a sequence of 1024 steps and generates a microprogram interrupt request each time it reaches the values 0 or 512. At these interrupts, the microprogram increments the continued (more significant part) counter value in memory. This process creates the "raw time", which is 64 bits long: The format is a 63-bit count of 15-nanosecond clock ticks, with bit 9 (the most significant bit of the 10-bit hardware counter) duplicated into bit 10. The reason for duplicating the most significant bit of the hardware part of counter in the least bit of the software part of the counter is to be able to determine (by the fact that the two bit positions differ) that the software part has been incremented after the hardware timestamp was made (which can happen if the timestamp is taken care of by higher-level software), and to be able to set up a coincidence value close to the counter wrap (see below).

A 10-bit register is arranged to copy the contents of the 10-bit counter when a timestamp pulse arrives. This pulse is generated in the Ethernet MAC logic, at the time an SFD byte is transferred to or from the Ethernet PHY interface. The pulse also generates an interrupt request to the micro-program, which will then read the register and deliver it, together with its more significant continuation, upward to the software as a timestamp, via a queue in memory. This timestamp is in raw time when read from the register, but the microcode converts it to a precise time value as previously described, before delivering it to the software layer. The timestamps are also qualified by the microcode: they are discarded if they turn out not to have been caused by the transmission of a "sync" message or the reception of a "delay response" message. Those that are not discarded are ordered in a queue together with the associated data about the message.

Generation of a precise time signal from the local clock may be performed in the following way:

The timer system hardware is configured such that the value in the 10-bit counter is continually compared with the contents of a 10-bit coincidence register, and that at coincidence, i.e. when their contents are equal, an output port changes state, and a micro-program interrupt request is generated. The microcode will then calculate what the contents of the 10-bit counter will be at the time of the next transition of the output, and load that value into the coincidence register. Coincidence will also be conditioned on the more significant continuations to be equal, and the microcode is responsible for that part of the comparison.

Figure 9:
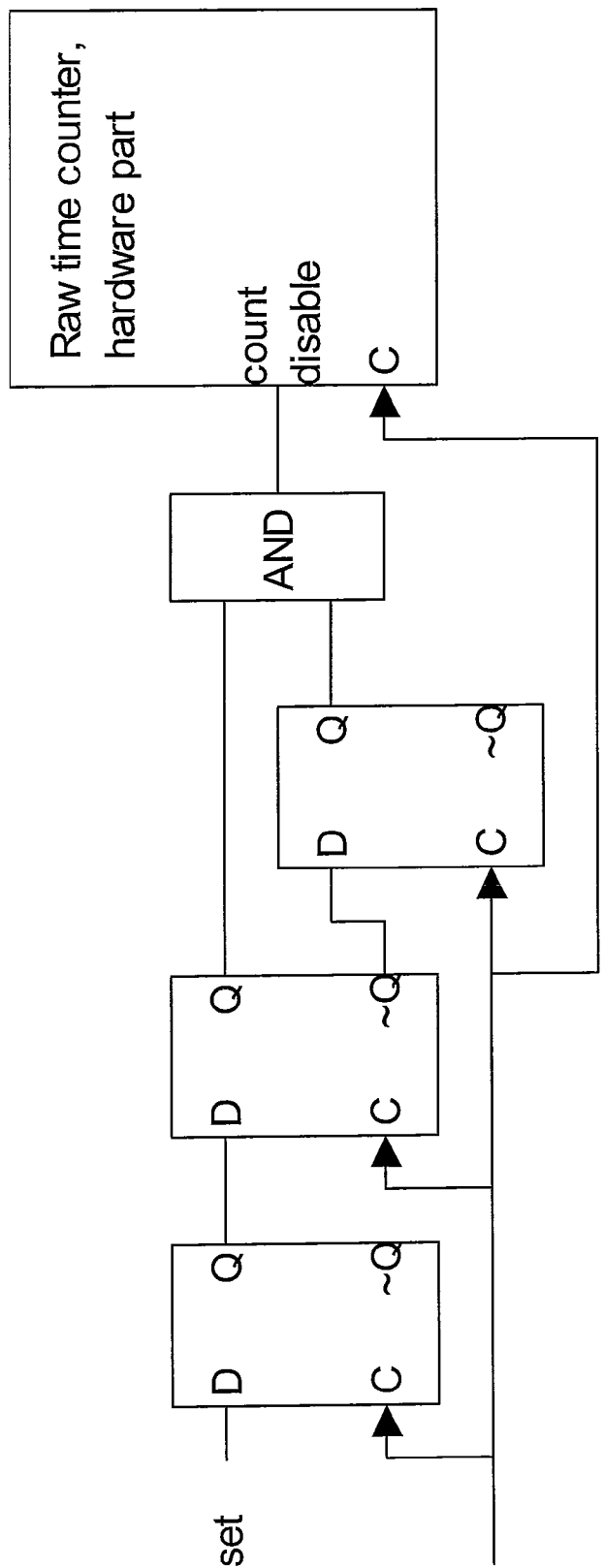
FIG. 9 is a schematic block diagram illustrating an example of how the precision can be increased without increasing the width of the calculation.

In an optional extension, the timer system is configured for inhibiting an increment of the counter of the counter-based time generator at predetermined intervals to increase the precision of the raw base time. This represents a way of increasing the precision without increasing the width (number of bits) of the calculation. Preferably, the speed of the local clock would first be set by adjusting the parameter A, the drift setting, as described. If the parameter, due to its limited number of bits, cannot be set exactly as desired, then it is normally set at the nearest value that makes the virtual local precise time clock go faster than it should. If the resolution of the setting is in billionths, i.e. nanoseconds per second, then one more bit of precision can be achieved by letting one control bit decide whether or not to inhibit one incrementing of the raw time every 2 seconds. A further bit of precision can be achieved by letting a second control bit decide whether or not to inhibit one additional incrementing of the raw time every 4 seconds, and so on. This can be accomplished simply by a flip-flop, which may be set by a software call. When it has been set, it disables the clocking of the counter for exactly one clock cycle, and is then reset again. Reference can be made to FIG. 9. The "set" input must be synchronized to the clock signal C, which is the clock signal that also drives the counter. A software routine, triggered e.g. once every second, determines when a cycle shall be inhibited.

Figure 10:
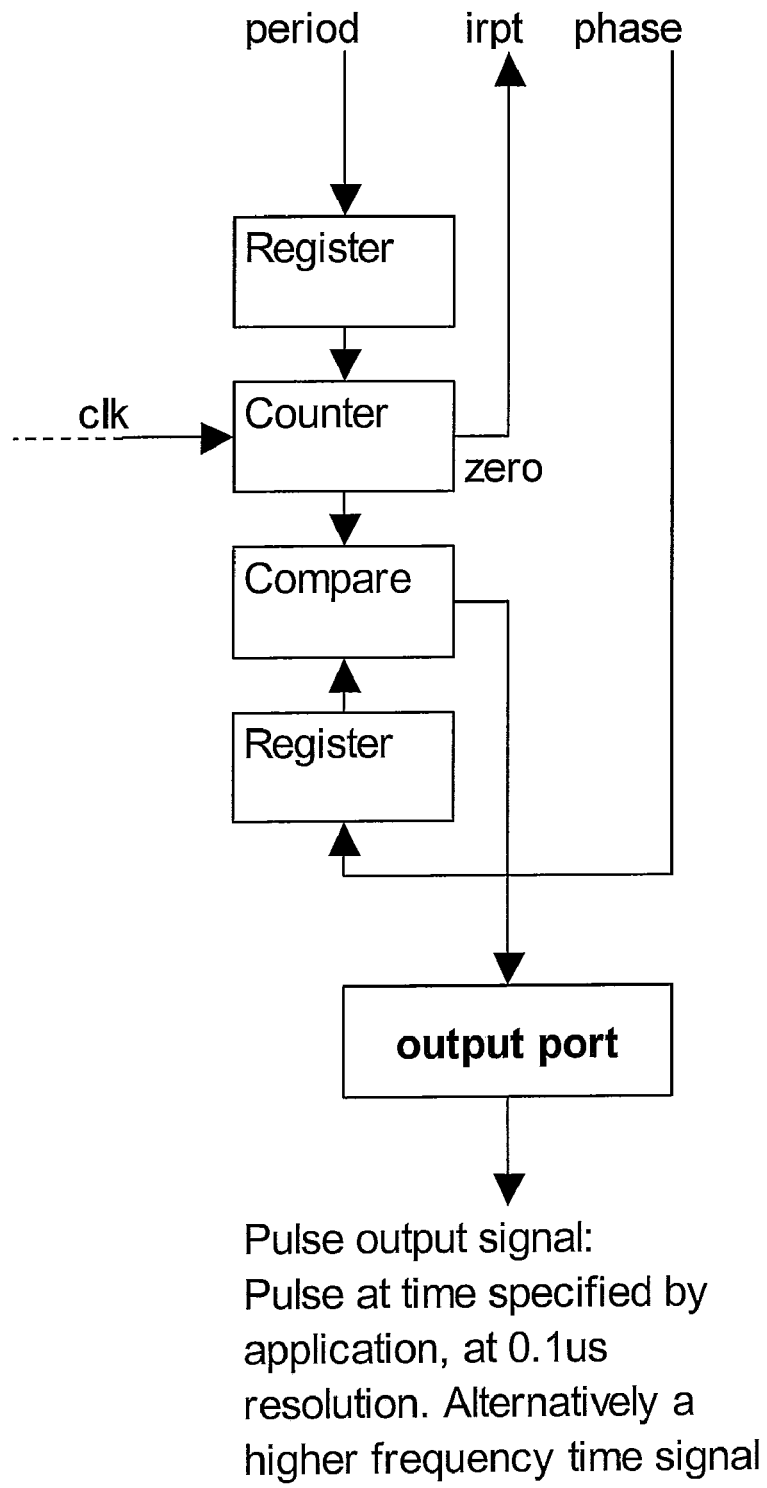
FIG. 10 is a schematic block diagram illustrating an example of how a second output can be generated that can have a higher frequency than the first output.

FIG. 10 describes how a second output can be generated. This added hardware can generate a precise time signal that can have a higher frequency than that of the first output, since it doesn't need an action from the processor for every transition on the output. Alternatively it can generate a pulse at a given time specified by an application program. A second counter is used. This counter is reloaded from a register each time it reaches zero, and thus the frequency of counter laps is determined by the register contents. The phase of the output is separately controlled, by the contents of a second coincidence register connected to the second counter. The counter counts the same clock pulses as the first counter. i.e. it counts raw time units. Thus, the settings of the registers have to be calculated by conversion from precise time as described above.

In a further development, the present invention increases the time a base station or similar apparatus or device can operate without receiving synchronization. It can be used with any kind of oscillator, such as OCXO or TCXO or a simple uncompensated crystal oscillator.

A temperature sensor is placed in the vicinity of the oscillator or the crystal used by the oscillator, i.e. near or in contact with the oscillator or the crystal. A processor monitors a temperature variable TV derived from the sensor. TV may be a digital value that represents the temperature, preferably in a monotonic way, but it is not required that we know the exact dependency.

A base station is normally required to be operational always or almost always, i.e. it will be operational during considerable part of the time when synchronization is available.

During the time the system is synchronized, the processor inputs and stores a suitably quantized value of TV, e.g. at regular time intervals, and each time it does this it also stores the value of a control variable CV, a variable characteristic to the output of its frequency control.

For example, if the adder principle is used it would be suitable to store the current increment value. On the other hand, if a tuning input on the oscillator is used it would instead be suitable to store the value used for driving that input.

It is of course also possible to combine these two control methods, perhaps in order to achieve finer resolution, i.e. smoother control, or increased range. In the combined case it might be of interest to store both values, or a value produced by combining them in an appropriate way, i.e. a way that produces a value with increased resolution or larger range, respectively, and using this combined value as the variable CV.

Using the recorded sets of values, the processor constructs a look-up control table in its memory, which describes how the control variable CV typically varies with TV. TV would be quantized into a suitable number of discrete possible values, and the table would have a CV entry for each such TV value. For example, each temperature reading from the temperature sensor is normally digitized by an AID-converter provided in connection with the temperature sensor, and converted into a quantized form for storage in the look-up control table in association with a current value of the control variable CV.

Figure 11:
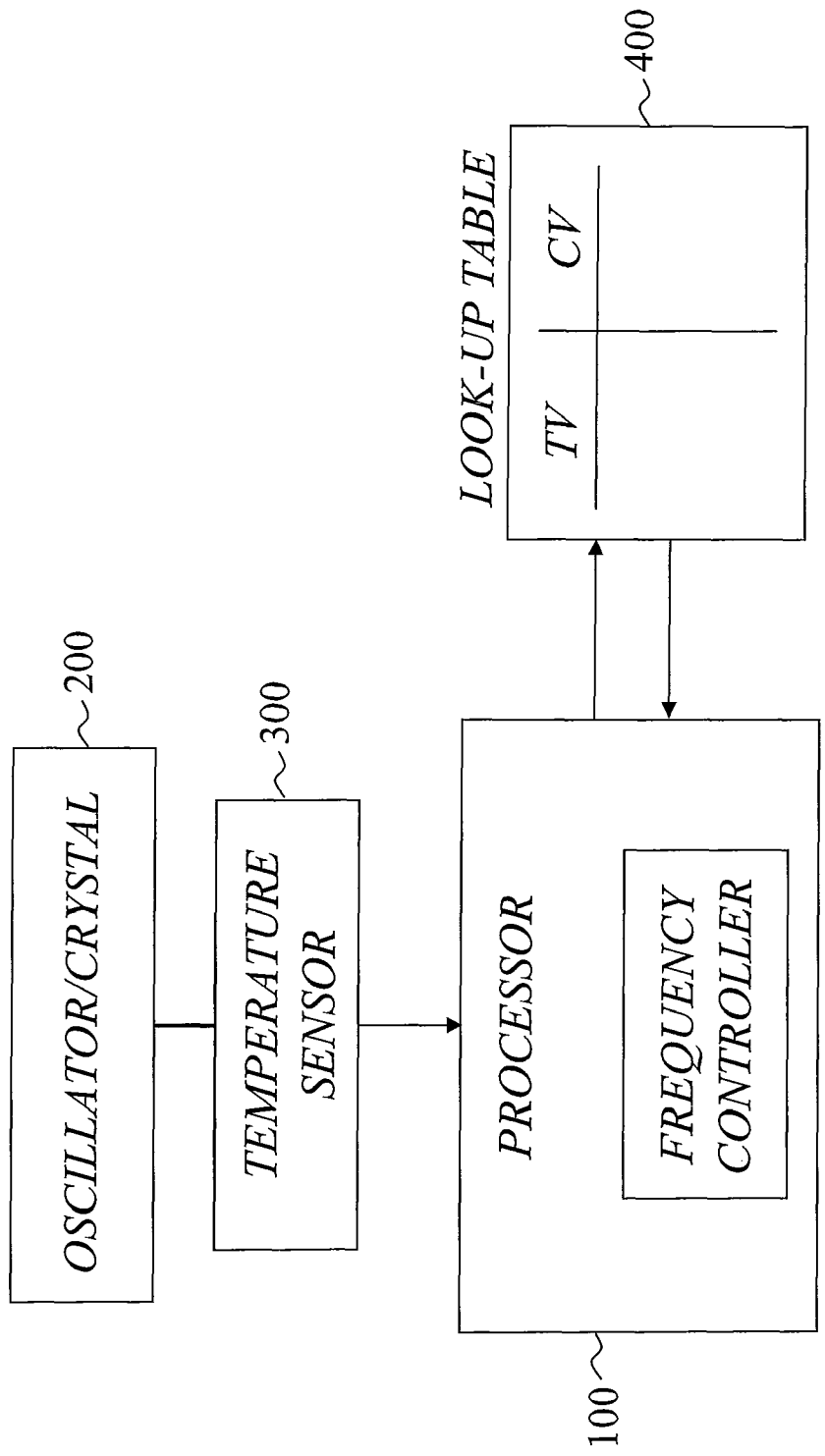
FIG. 11 is a schematic block diagram illustrating a look-up table based system for synchronization to be used together with a timer system and/or time synchronization system.

FIG. 11 is a schematic block diagram illustrating a look-up table based system for synchronization to be used together with an electronic time or timer system and/or time synchronization system as previously presented. The system is arranged in relation to an oscillator 200 or a crystal used by the oscillator, and includes a temperature sensor 300 for sensing the temperature in the proximity of the oscillator/crystal 200, and a processor 100 which interacts with a memory-based look-up table 400 in which control values CV are stored in association with suitably quantized temperature values TV.

As indicated above, the look-up control table preferably comprises a number of cells for holding control values representative of the parameter variable A at different temperatures, wherein the cells are addressable by means of respective quantized temperature values.

For example, the specified operating temperature range of the apparatus may be 0 . . . 70 degrees Celsius, and the expected digital input from the temperature sensor via the analog-to-digital converter for that range may be the hexadecimal numbers 030 . . . 22F, i.e. decimal 48 . . . 559, which means 512 different numbers can be expected. These numbers should represent the temperature in a monotonic way, preferably not too far from being a linear function, but the dependence need not be exactly known. Assume a table size of 128 entries is considered suitable. After reading such a value the program would subtract 48 and do an integer divide by 4 and thus obtain a number in the range 0 . . . 127 (decimal), which is suitable to use as a table index. If the sensor has a known nonlinear characteristic, then the transformation could instead be nonlinear as required to compensate for the expected sensor characteristic. Now, assume the described linear transformation is used. A temperature of 20 degrees Celsius may result in a digital input of 194 (decimal) which would result in a table index of 36 to be used when accessing the table for storing a control variable. At another sampling time the temperature may be 27 degrees and that may result in a digital input of 245, which would result in addressing the table cell having index 49.

Each time the table is addressed like this, in the table construction phase, a value is written in the addressed cell. This should be a value from which the control variable can be obtained. Typically the adjustments of the control variable are very small (may be parts per billion), so it might be suitable to store the difference between the desired value and a known constant.

The described process is repeated at a number of occasions to build up the look-up table. The contents of the cells with the highest and lowest indices that have been encountered should preferable be copied to higher and lower index cells (if any), respectively. Index values that have not yet been encountered should be given values that are such that the table values, as a function of index, is a monotonic function. In order to assure this, each table entry should also have a flag marking whether the corresponding temperature range has been encountered or not. In the preferred embodiment a software routine, which is called after each writing in a cell corresponding to a non-encountered index, updates any adjacent cells, and cells adjacent to them, if the cells correspond to non-encountered indices. If this cell is, or these cells are, between two cells that do correspond to encountered index values, i.e. the cell or cells do not represent temperatures above the highest or below the lowest encountered, then the routine fills them with interpolated values of these two cells.

Later on, when no synchronization source is available, the look-up table can be used for continued, uninterrupted control by reading a temperature value, quantizing it and using the quantized value for addressing the respective cell in the table to extract a control value. For example, if the digital input value for the temperature is 194 a table index of 36 would be calculated and used to address the correct cell in the look-up table to get hold of the associated control value.

The regulation cannot be perfectly smooth, since it is preferably digital (based on numbers with limited resolution) and sampling (e.g. once per second) rather than continuous control. Therefore the control variable CV will normally oscillate back and forth, i.e. contain some degree of noise. It may also change slowly due to other causes than the temperature. Rather than letting each new CV table value replace the old CV table value for the current TV table index, they could for example be combined in a way that partly preserves the history, e.g. a new entry could be calculated as p*(the latest CV)+(1−p)*(the old entry), where p is a number between 0 and 1, which determines the relative weight of the latest sample of CV in the combination. This calculation should, for practical reasons, preferably be done on the table values, i.e. not on the actual CV values if the table stores differences between CV and a known constant, as described above. Many other formulas could alternatively be used for this filtering process. The process aims to use the latest information, but also filter out some of the noise by taking into account an average of recent values when updating the table. In other words, the system is preferably configured for updating, for each of a number of cells in the look-up control table, a control value representative of the parameter variable A based on a weighted average of a current value of the parameter variable A and also one or more older values of the parameter variable A at a predetermined temperature.

Slow change of crystal resonance frequency due to aging is normal, and if the process is sufficiently well known it can be used as a basis for prediction, whereby table entries based on very old measurements could be improved. If not known beforehand, a slow trend could be measured, by collecting statistics of the development of the table values. CV values for one of, or some of, the most common TV values can be saved at regular occasions, and a prediction can be done by extrapolation or some other common prediction method. The result would then be used for adjustment, e.g. at the same occasions, of CV values in cells corresponding to TV values that have not been encountered recently. This will require that each table entry contains also a coarse time stamp, e.g. a code for the week number for the last encounter of that TV value.

If no source of synchronization is available, then the program will use the table for continued control, i.e. it would change the control value and thus the speed of the clock, as the servo would do, but it would do it based on reading a temperature value from the temperature sensor and using a suitable representation of this temperature value for finding the corresponding control value CV in the table. The extracted control value CV is then applied for frequency control.

In a preferred embodiment the program keeps track of the highest and lowest values of TV that has been registered. When encountering a higher TV value that the previously highest one, it fills the corresponding CV value into not only the table entry corresponding to the TV value, but also to all entries for higher TV values. When encountering a lower TV value that the previously lowest one, it fills the corresponding CV value into not only the table entry corresponding to the TV value, but also to all entries for lower TV values.

The system should preferably have a non-volatile memory, such as flash memory, in which the table either is being kept all the time, or into which it is saved regularly in case of power failure.

Figure 12:
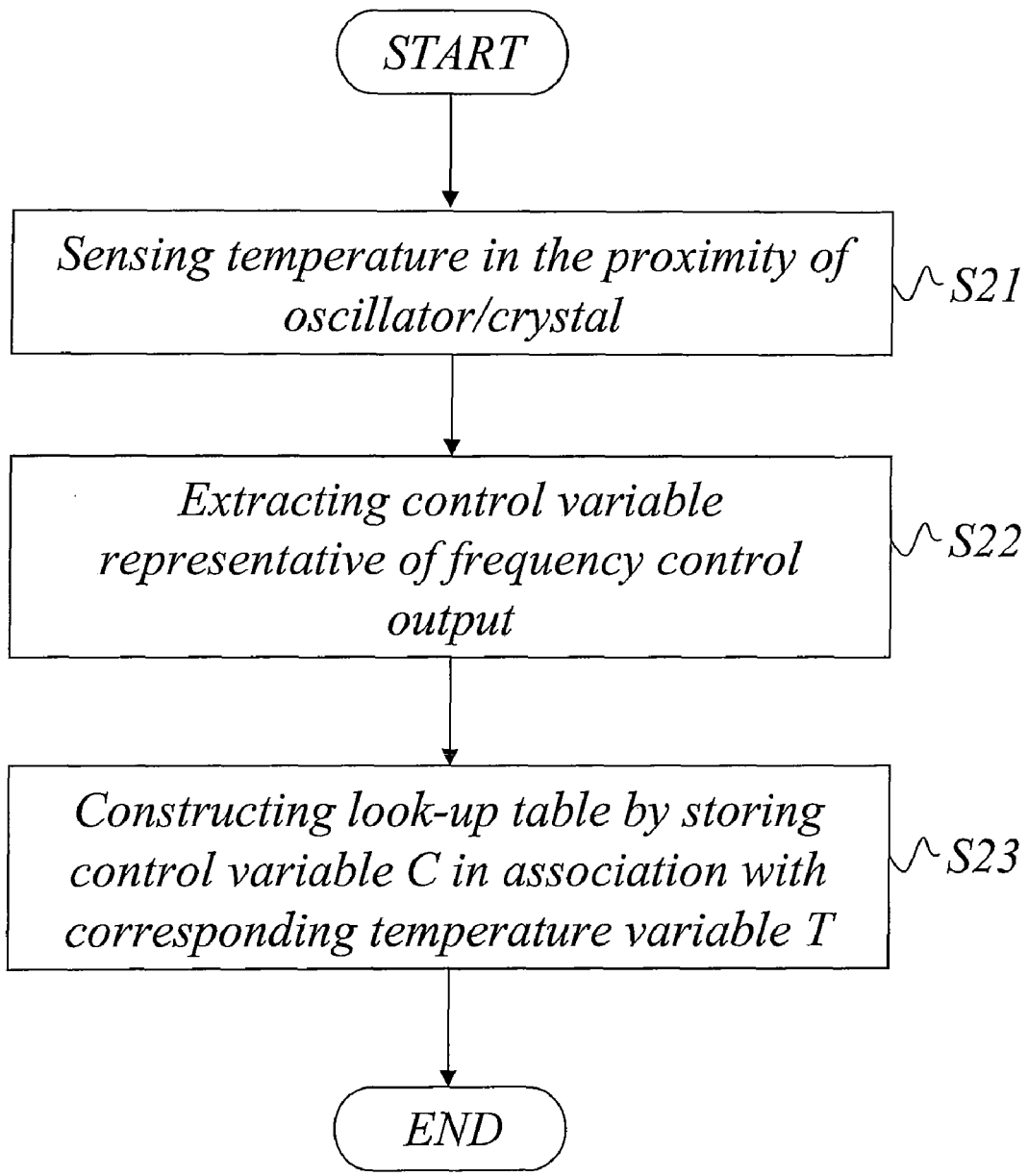
FIG. 12 is a schematic flow diagram illustrating a so-called data acquisition and table construction phase of an exemplary embodiment of the present invention.

In summary, when the system is synchronized, in a so-called data acquisition and table construction phase, the temperature is sensed at different occasions, and a corresponding digitized and quantized temperature value/variable TV representative of the sensed temperature is used for addressing a look-up control table to store an associated control value/variable CV representative of a current frequency control output variable used for controlling the frequency, as schematically illustrated in the exemplary flow diagram of FIG. 12. In step S21, the temperature is sensed. In step S22, the value of a corresponding control variable is extracted. In step S23, a look-up table is constructed by storing a control value/variable CV in association with a suitably quantized temperature value/variable TV, preferably using the quantized temperature value for addressing a cell in the look-up table in which the associated control value is stored.

Figure 13:
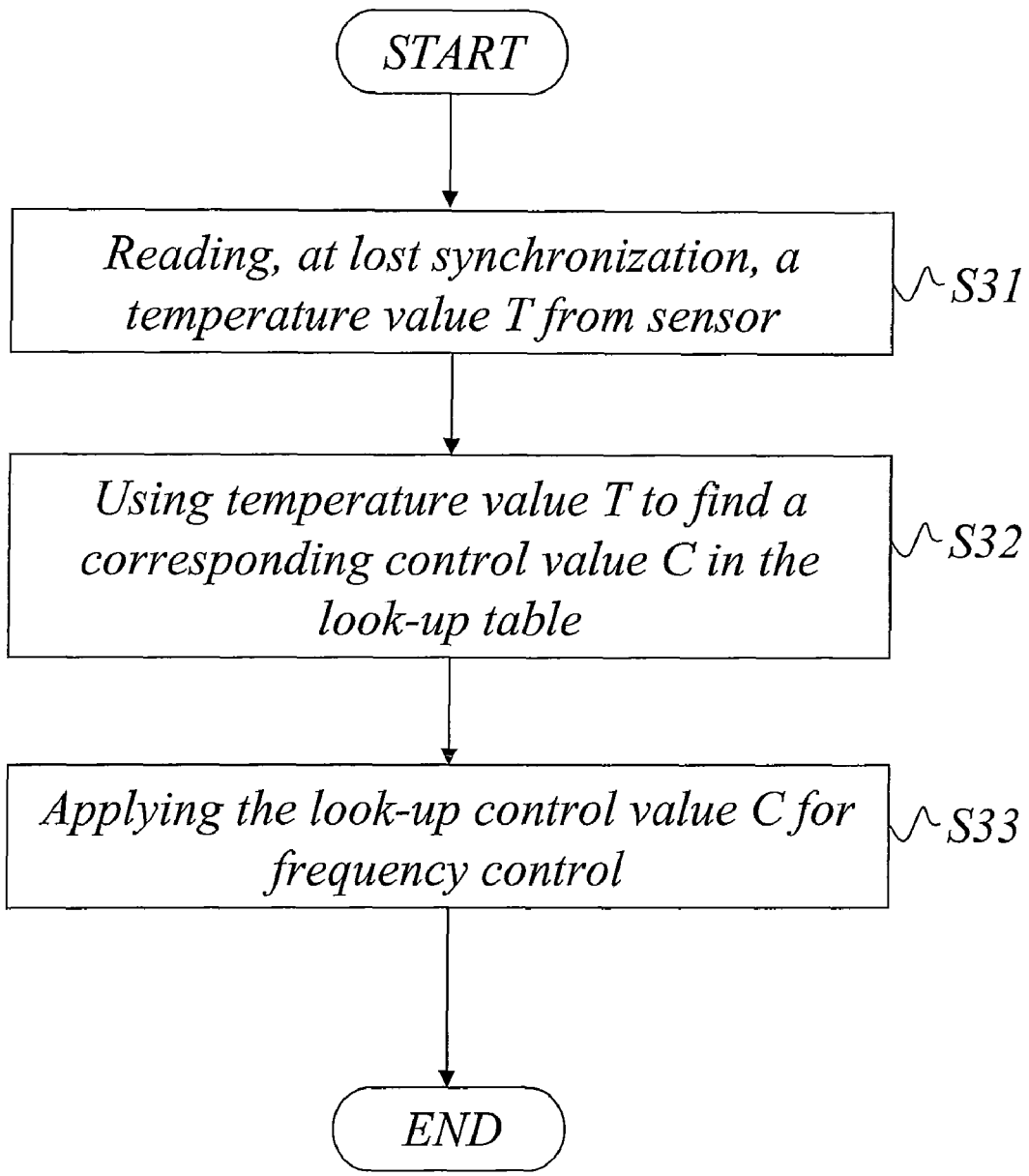
FIG. 13 is a schematic flow diagram illustrating a so-called table-based control phase of an exemplary embodiment of the present invention.

When synchronization is lost, the system switches to a so-called table-based control phase. In this phase, a temperature value is read from the sensor, and converted into quantized form as a quantized temperature value TV, which can be used to extract a corresponding control value CV from the previously constructed look-up table. The extracted control value CV is then used as the frequency control output of the synchronization system, as schematically illustrated in the exemplary flow diagram of FIG. 13. In step S31, a temperature value is read form the temperature sensor. In step S32, a suitable representation of the temperature value is used to find a corresponding control value CV in the look-up table. In step S33, the look-up control value CV is used for frequency control and synchronization.

In a timer system as described above, there is a counter-based time generator for continuously and directly generating raw base time, and a translator, to be used when needed, for translating between raw base time, denoted $t_r$, and local precise time, denoted $t_p$, of the timer system. The translator is preferably configured for operation based on the relation $t_p = A \cdot t_r + B$, where A and B are configurable parameter values.

It can for example be used for generating local precise time by capturing a raw base time value, denoted $t_r$, in response to an external event such as a trigger pulse, and calculating, when needed, local precise time, denoted $t_p$, based on the above relation $t_p = A \cdot t_r + B$.

It can also be used for generating a precisely timed output signal by first defining a precise time, denoted $t_p$, of a desired timing event for the output signal, calculating a coincidence value as a corresponding raw base time value, denoted $t_r$, based on the relation $t_r = (t_p - B)/A$, and generating the precisely timed output signal when a value of continuously generated raw time base is equal to the so-called coincidence value.

It would thus be suitable to for example store the parameter A as the control value CV during the data acquisition and table construction phase, and use the extracted control value CV from the look-up table as A in the above formulas for generating local precise time or for the purpose of generating a precisely timed output signal during the table-based control phase. For example, the control variable A controls the speed of the local "virtual" clock, whereas B controls the setting of the current time.

Figure 14:
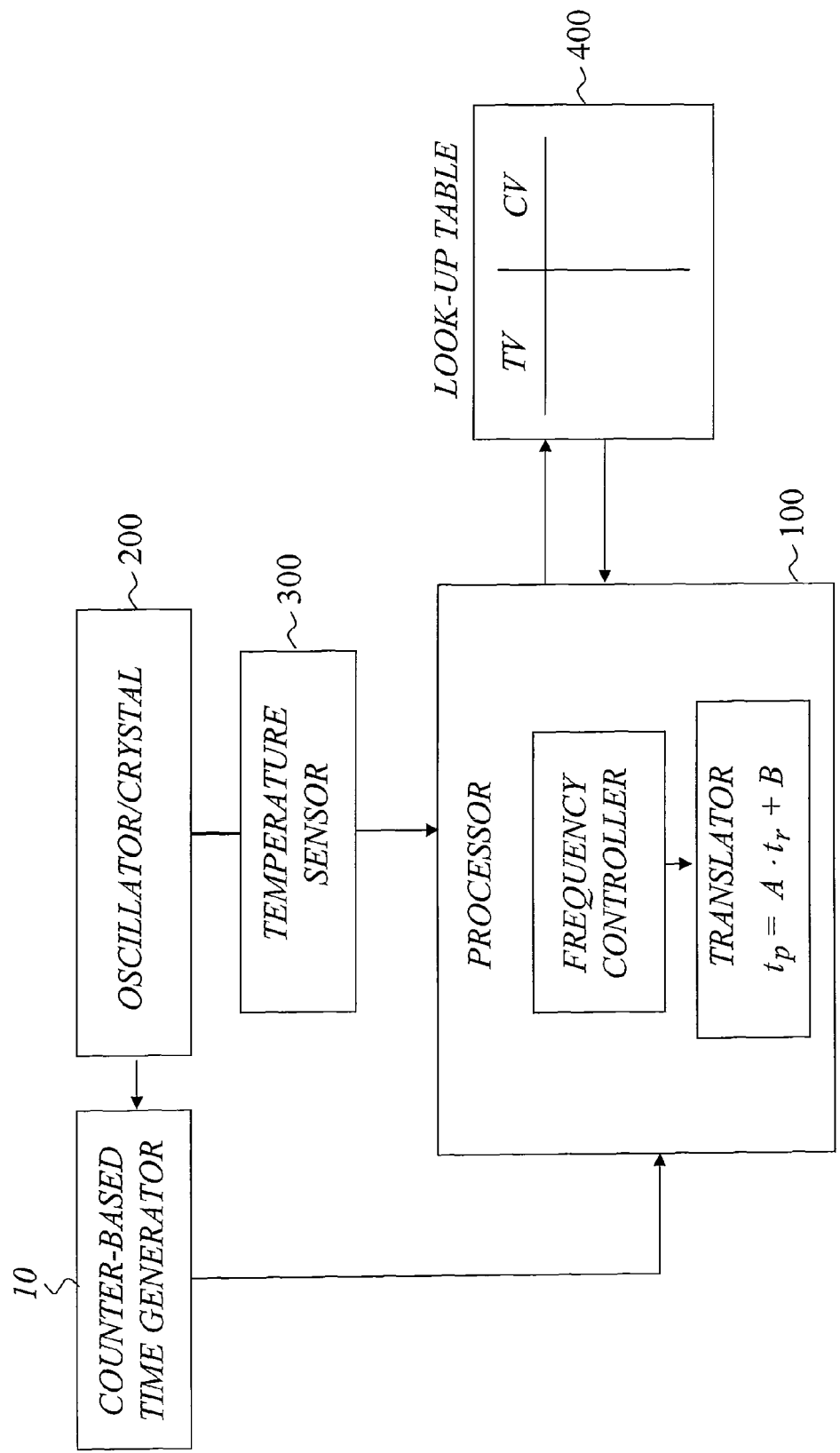
FIG. 14 is a schematic block diagram illustrating an electronic clock/time/timer system according to a preferred, exemplary embodiment of the invention.

In a preferred exemplary embodiment of the invention, schematically illustrated in FIG. 14, the electronic timer system comprises a counter-based time generator 10 for continuously generating raw base time, and a translator for translating between raw base time and local precise time, as previously described. The translator is preferably implemented as control logic (hardware/software) in a processor 100. The counter-based time generator 10 is driven by an oscillator 200. The time system further comprises a temperature sensor 300 placed in the proximity of the oscillator 200 or a crystal used by the oscillator, and a look-up control table 400 for holding control values representative of the configurable parameter value A stored in association with corresponding temperature values. The look-up table 400 is constructed from pairs of values of temperature and the parameter A sampled at suitable intervals. The look-up control table 400 is generated when the timer system is synchronized with a synchronization source (not shown) so that the temperature and control values are characteristic of the operation of the timer system in synchronization. The timer system is also configured for reading, when no synchronization source is available, a temperature value from the temperature sensor 300, and for extracting, based on the temperature value, a control value from the look-up control table 400 corresponding to a suitable (quantized) representation of the temperature value. The timer system is then able to configure the parameter variable A in accordance with the extracted control value. This is preferably performed at suitable intervals.

The look-up table based synchronization for controlling the parameter variable A can be used in combination with any of the previously described features of the translator-based timer system. For example, this aspect of the invention is particularly useful for time distribution applications such as Network Time Protocol (NTP) and IEEE 1588 Precise Time Protocol (PTP) applications, and the electronic timer system may be used in time distribution systems such as IEEE 1588 systems.

The embodiments described above are merely given as examples, and it should be understood that the present invention is not limited thereto. Further modifications, changes and improvements which retain the basic underlying principles disclosed and claimed herein are within the scope of the invention.

The invention claimed is:

1. An electronic timer system comprising:
a counter-based time generator for continuously generating raw base time, said counter-based time generator being driven by an oscillator;
a translator for translating between raw base time, denoted $t_r$, and local precise time, denoted $t_p$, of the timer system based on the following relation:

$$t_p = A \cdot t_r + B,$$

where A and B are configurable parameter variables;
a temperature sensor placed in the proximity of the oscillator or a crystal used by the oscillator;
a look-up control table in memory holding control values representative of the configurable parameter variable A stored in association with corresponding temperature values, said look-up control table being constructed, from pairs of values of temperature and the parameter variable A sampled at suitable intervals, when the timer system is synchronized with a synchronization source;
wherein said timer system is configured for reading, when no synchronization source is available, a temperature value from said temperature sensor, and extracting, based on said temperature value, a control value from said look-up control table corresponding to a representation of said temperature value, and configuring the parameter variable A based on the extracted control value at suitable intervals.

2. The timer system of claim 1, wherein said system is configured for capturing a raw base time value from said counter-based time generator in response to an external event such as a trigger pulse; and
said translator is configured for calculating local precise time based on said raw base time value and the parameter values A and B.

3. The timer system of claim 1, wherein said system is configured for defining precise time of a desired timing event;
said translator is configured for calculating a coincidence value as a corresponding raw base time value based on the defined precise time and the parameter values A and B; and
said timer system is configured for generating a timed output signal when a value of the continuously generated raw base time of the counter-based time generator is equal to the calculated coincidence value.

4. The timer system of claim 1, wherein said translator is operated only when needed for translating between raw base time and precise time, thereby reducing the power consumption of the timer system.

5. The timer system of claim 1, wherein said system is configured for setting the parameter values A and B, where A controls the speed of the virtual clock and B controls the setting of the current time.

6. The timer system of claim 1, wherein said translator is implemented by software or microcode for execution by a processor.

7. The timer system of claim 1, wherein said timer system is configured for time distribution applications such as Network Time Protocol (NTP) and IEEE 1588 Precise Time Protocol (PTP) applications.

8. The timer system of claim 1, wherein said look-up control table comprises a number of cells for holding control values representative of the parameter variable A at different temperatures, wherein said cells are addressable by means of respective quantized temperature values.

9. The timer system of claim 8, wherein said timer system is configured for updating, for each of a number of cells in said look-up control table, a control value representative of the parameter variable A based on a weighted average of a current value of the parameter variable A and at least one older value of the parameter variable A at a predetermined temperature.

10. A time distribution system comprising an electronic timer system of claim 1.

11. The time distribution system of claim 10, wherein said time distribution system is based on IEEE 1588.

* * * * *

UNITED STATES PATENT AND TRADEMARK OFFICE
CERTIFICATE OF CORRECTION

PATENT NO. : 8,402,302 B2  Page 1 of 1
APPLICATION NO. : 13/001916
DATED : March 19, 2013
INVENTOR(S) : Blixt et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 328 days.

Signed and Sealed this
First Day of September, 2015

Michelle K. Lee
*Director of the United States Patent and Trademark Office*